US009171996B2

(12) United States Patent
Kim et al.

(10) Patent No.: US 9,171,996 B2
(45) Date of Patent: Oct. 27, 2015

(54) LOW-VOLTAGE HIGH-GAIN HIGH-SPEED GERMANIUM PHOTO DETECTOR AND METHOD OF FABRICATING THE SAME

(71) Applicant: Electronics and Telecommunications Research Institute, Daejeon (KR)

(72) Inventors: Gyungock Kim, Daejeon (KR); Sang Hoon Kim, Daejeon (KR); Ki Seok Jang, Daejeon (KR); In Gyoo Kim, Daejeon (KR); Jin Hyuk Oh, Uijungbu (KR); Sun Ae Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/949,081

(22) Filed: Jul. 23, 2013

(65) Prior Publication Data

US 2014/0048772 A1     Feb. 20, 2014

(30) Foreign Application Priority Data

Aug. 20, 2012 (KR) .................. 10-2012-0090860
Mar. 28, 2013 (KR) .................. 10-2013-0033585
May 29, 2013 (KR) .................. 10-2013-0061169

(51) Int. Cl.
*H01L 33/06* (2010.01)
*H01L 33/00* (2010.01)
*H01L 31/0352* (2006.01)
*H01L 31/107* (2006.01)
*B82Y 20/00* (2011.01)

(52) U.S. Cl.
CPC ........ *H01L 33/06* (2013.01); *H01L 31/035227* (2013.01); *H01L 31/035254* (2013.01); *H01L 31/107* (2013.01); *H01L 33/0054* (2013.01); *B82Y 20/00* (2013.01); *Y10S 977/762* (2013.01); *Y10S 977/774* (2013.01); *Y10S 977/954* (2013.01)

(58) Field of Classification Search
USPC ................................. 257/21; 438/94
See application file for complete search history.

(56) References Cited

U.S. PATENT DOCUMENTS

| 6,074,892 | A | * | 6/2000 | Bowers et al. ................ 438/57 |
| 7,209,623 | B2 | | 4/2007 | Morse |
| 7,233,051 | B2 | | 6/2007 | Morse et al. |
| 7,683,397 | B2 | | 3/2010 | Sarid et al. |
| 7,741,657 | B2 | | 6/2010 | Pauchard et al. |
| 2002/0063303 | A1 | * | 5/2002 | Pauchard et al. ............ 257/461 |
| 2007/0262296 | A1 | * | 11/2007 | Bauer ............................ 257/19 |
| 2012/0051383 | A1 | * | 3/2012 | Stern ........................ 372/50.21 |

OTHER PUBLICATIONS

Yimin et al ("Monolithic germanium/silicon avalanche photodiodes with 340 GHz gain-bandwidth product", published online on Dec. 7, 2008).*

Yimin Kang et al., "Monolithic germanium/silicon avalanche photodiodes with 340 GHz gain—bandwidth product", Nature Photonics, Jan. 2009, pp. 59-63, vol. 3, Macmillan Publishers Limited.

* cited by examiner

*Primary Examiner* — Khaja Ahmad

(57) ABSTRACT

Provided is a silicon-wafer-based germanium semiconductor photodetector configured to be able to provide properties of high gain, high sensitivity, and high speed, at a relatively low voltage. A germanium-based carrier multiplication layer (e.g., a single germanium layer or a germanium and silicon superlattice layer) may be provided on a silicon wafer, and a germanium charge layer may be provided thereon, a germanium absorption layer may be provided on the charge layer, and a polysilicon second contact layer may be provided on the absorption layer. The absorption layer may be configured to include germanium quantum dots or wires.

18 Claims, 13 Drawing Sheets

LOW-VOLTAGE HIGH-GAIN HIGH-SPEED GERMANIUM PHOTO DETECTOR AND METHOD OF FABRICATING THE SAME

CROSS-REFERENCE TO RELATED APPLICATIONS

This U.S. non-provisional patent application claims priority under 35 U.S.C. §119 to Korean Patent Application Nos. 10-2012-0090860, 10-2013-0033585, and 10-2013-0061169, filed on Aug. 20, 2012, Mar. 28, 2013, and May 29, 2013, respectively, in the Korean Intellectual Property Office, the entire contents of which are hereby incorporated by reference.

BACKGROUND OF THE INVENTION

Example embodiments of the inventive concept relate to a photodetector, and in particular, to a low-voltage high-gain high-speed germanium detector realized on a silicon substrate.

Recently, silicon photonics is actively being researched. Especially, a CMOS-compatible cost-effective high-performance germanium photo detector is being actively researched to realize an ultra-high-speed large capacity optical communication system and an image processing system, and speed and sensitivity of the photo detector are emerging as major issues. Further, there is an increasing interest in finding whether cost-effective high-performance silicon photonics-based germanium-on-silicon optical receivers can replace the conventional III-V compound semiconductor-based optical receiver.

A III-V compound semiconductor-based avalanche optical receiver, an expensive optical receiver, is widely used for a highly sensitive optical communication system. The III-V compound semiconductor-based avalanche optical receiver suffers from high fabrication cost and a high operation voltage for achieving high sensitivity. Recently, a research is being started to replace the III-V compound semiconductor avalanche optical receiver with a silicon photonics-based avalanche optical receiver. Compared with the III-V compound semiconductor-based optical device, the silicon-based optical device is cost-effective, and thus, it is expected to be commercialized. Further, the silicon-based optical device is superior in that it can be easily integrated with silicon electronic IC chips.

Nevertheless, to achieve high gain and high sensitivity, the silicon-based avalanche photodetector should be operated at a very high operation voltage (e.g., an avalanche voltage), and thus, it suffers from high power consumption. In this sense, there is a need to develop material and structure technology capable of realizing characteristics of low-voltage operation, high-gain, or high-speed.

SUMMARY

Example embodiments of the inventive concept provide a germanium-based photodetector and a method of fabricating the same.

Other example embodiments of the inventive concept provide a photodetector, which is configured to have operating characteristics of low voltage, high gain, and high speed, and a method of fabricating the same.

According to example embodiments of the inventive concepts, a photodetector may include a silicon substrate, a first contact layer on the substrate, a carrier multiplication layer on the first contact layer, a charge layer on the carrier multiplication layer, an absorption layer on the charge layer, and a second contact layer on the absorption layer. The carrier multiplication layer, the charge layer, and the absorption layer may include germanium.

In example embodiments, the absorption layer may include intrinsic germanium.

In example embodiments, the carrier multiplication layer may include intrinsic germanium.

In example embodiments, the first contact layer may be doped with first impurities.

In example embodiments, the charge layer may be doped with second impurities, whose conductivity type may be opposite to the first impurities.

In example embodiments, the second contact layer may be doped with the second impurities.

In example embodiments, the second contact layer may include germanium.

In example embodiments, the second contact layer may include polysilicon.

In example embodiments, the first contact layer may include silicon.

In example embodiments, the carrier multiplication layer may include a germanium and silicon superlattice.

In other example embodiments, a germanium and silicon superlattice may be used for the carrier multiplication layer.

In example embodiments, a quantum dot or a quantum wire may be used for the absorption layer.

In other example embodiments, a buried oxide layer may be provided between the substrate and the first contact layer.

In example embodiments, the absorption layer may include a germanium and silicon superlattice layer and an intrinsic layer.

In other example embodiments, the photodetector may further include a floating guard ring provided around the charge layer.

According to example embodiments of the inventive concepts, a method of fabricating a photodetector may include forming a first contact layer on a substrate, forming an carrier multiplication layer on the first contact layer, forming a charge layer on the carrier multiplication layer; forming an absorption layer on the charge layer, and forming a second contact layer on the absorption layer. Here, the carrier multiplication layer, the charge layer, the absorption layer may include germanium and the second contact layer may include doped polysilicon, and they may be formed in an in-situ manner in one chamber or cluster.

In example embodiments, the first contact layer may be formed of a silicon layer doped with first impurities.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
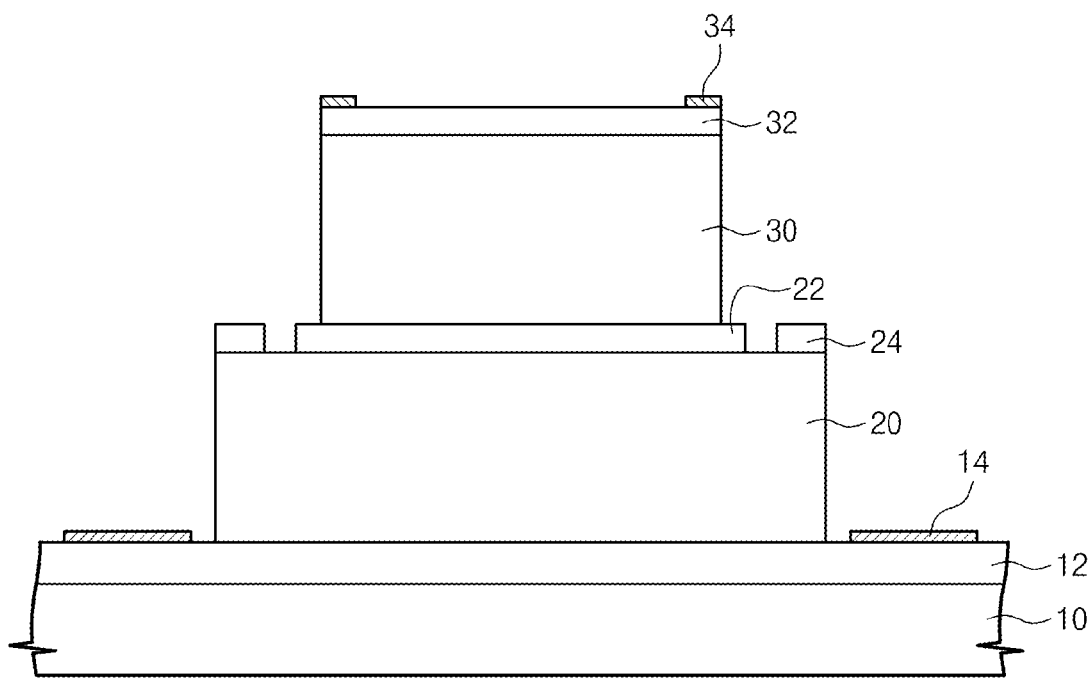
FIG. 1 is a sectional view illustrating a photodetector according to a first embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a photodetector according to a first embodiment of the inventive concept.

Referring to FIG. 1, the photodetector according to the first embodiment of the inventive concept may include a substrate 10, a first contact layer 12, a first electrode 14, a carrier multiplication layer 20, a charge layer 22, an absorption layer 30, a second contact layer 32, and a second electrode 34.

The substrate 10 may include silicon. The first contact layer 12 may include silicon doped with first impurities. The first impurities may be n-type donors, such as phosphorous. For example, the first contact layer 12 may include n++ silicon. The carrier multiplication layer 20 and the first electrode 14 may be provided on the first contact layer 12.

The carrier multiplication layer 20 may include intrinsic germanium. The carrier multiplication layer 20 may be configured to amplify an electrical signal in the absorption layer 30. For example, the carrier multiplication layer 20 may be configured to have an avalanche gain structure. The charge layer 22 may be provided on the carrier multiplication layer 20. The charge layer 22 may include germanium.

In example embodiments, the charge layer 22 may be formed of or include a thin germanium layer. The charge layer 22 may be configured to increase significantly electric field of the carrier multiplication layer 30. For example, the charge layer 22 may be a thin layer doped with second impurities (e.g., boron), whose conductivity is different from that of the first impurities, or a lightly-doped p-type thin layer. A floating guard ring 24 may be formed on the carrier multiplication layer 20 using the charge layer 22. The absorption layer 30 may be provided on the charge layer 22. The floating guard ring 24 of the first embodiment may be omitted or removed.

The absorption layer 30 may be configured to absorb light passing through the second contact layer 32 and generate an electric signal therefrom. The absorption layer 30 may include intrinsic germanium. The second contact layer 32 may be provided on the absorption layer 30. The second contact layer 32 may include polysilicon (e.g., p++ polysilicon) or germanium (e.g., p++ germanium) doped with the second impurities.

All of the carrier multiplication layer 20 and the absorption layer 30 may contain germanium. In addition, the carrier multiplication layer 20 and the absorption layer 30 may be formed, in an in-situ manner, in a chamber or cluster (not shown) by a reduced-pressure chemical vapor deposition, in which germanium is contained in a source material. This makes it possible to increase productivity in the fabrication process of the photodetector according to the first embodiment of the inventive concept.

Figure 2:
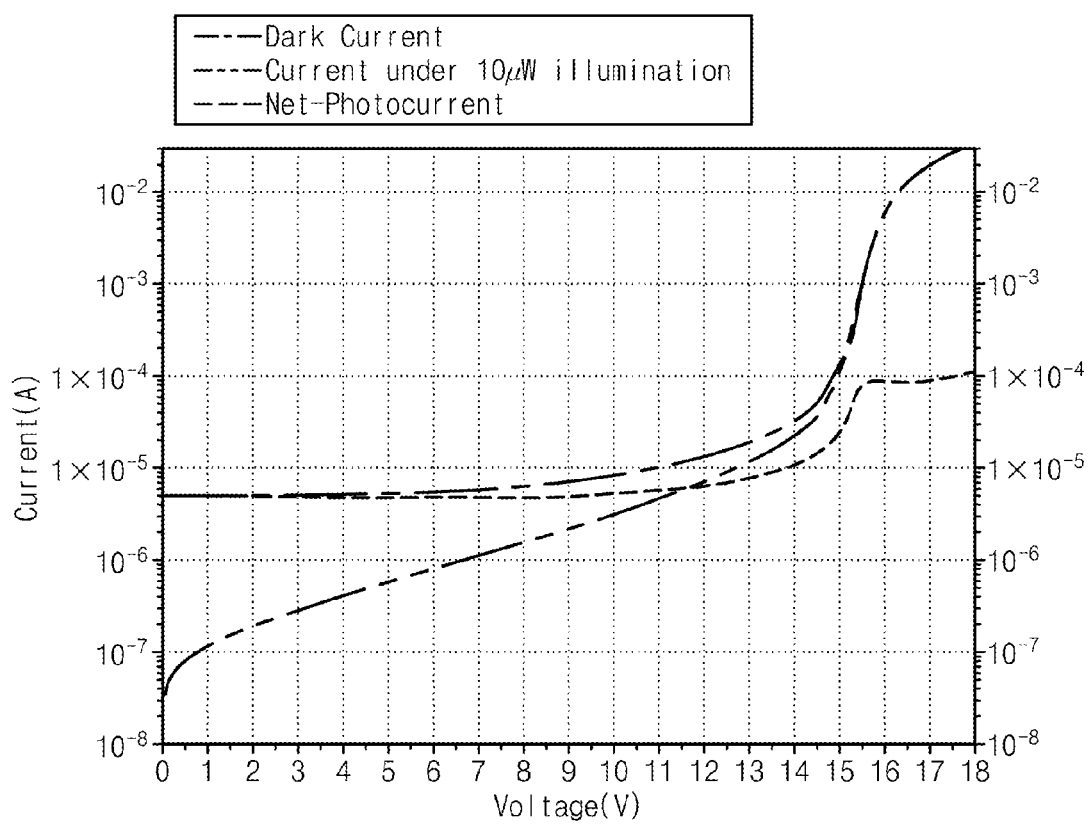
FIG. 2 is a graph showing I-V characteristics of the photodetector of FIG. 1.

FIG. 2 is a graph showing I-V characteristics of the photodetector of FIG. 1. As shown in FIG. 2, in the photodetector according to the first embodiment of the inventive concept, the avalanche took place at a low voltage of about 15-16V. In the conventional avalanche photodetector, the avalanche takes place at a high voltage of about 30V or higher. In other words, FIG. 2 shows that the photodetector according to the first embodiment of the inventive concept can be operated at a relatively low voltage. In FIG. 2, x- and y-axes represent voltage and current, respectively. FIG. 2 shows that high-speed and high-gain properties can be achieved, even when each of the absorption layer 30 and the carrier multiplication layer 20 has a large thickness of about 10000 Å.

Figure 3:
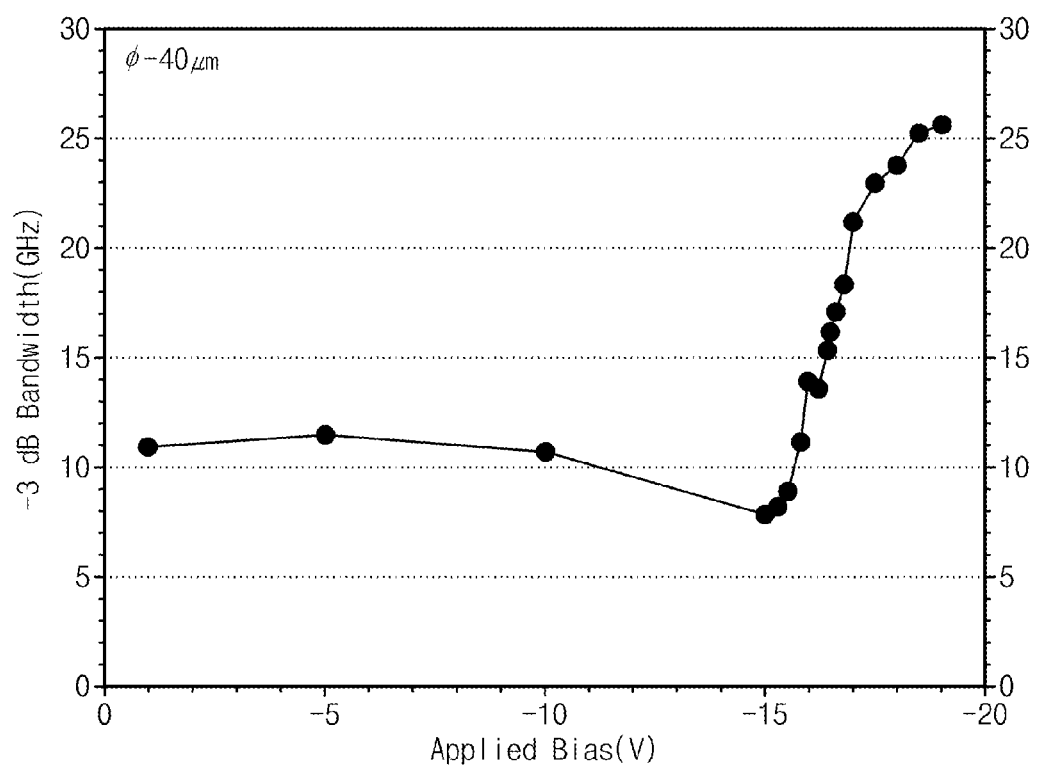
FIG. 3 is a graph showing a relationship between an operational voltage and a frequency response.

FIG. 3 is a graph showing a relationship between an operational voltage and a frequency response of the photodetector according to the first embodiment of the inventive concept. As shown in FIG. 3, in the photodetector according to the first embodiment of the inventive concept, 3 dB bandwidth was abruptly increased at a bias voltage of about −15V or higher. This is an opposite behavior, compared to the conventional avalanche photodetector exhibiting −3 dB bandwidth property decreasing at a high bias voltage. In other words, the photodetector including the germanium charge layer and the carrier multiplication layer 20, according to example embodiments of the inventive concepts, can have both of high-speed and high-gain properties.

Accordingly, the photodetector according to the first embodiment of the inventive concept can be operated with high gain and high speed.

Figure 4:
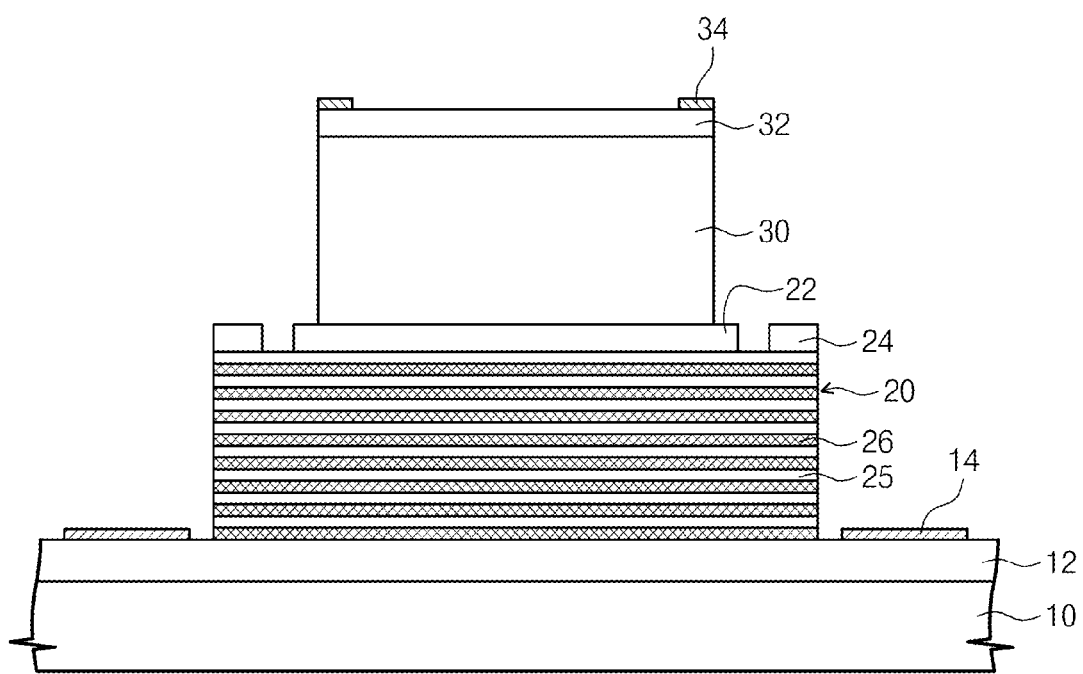
FIG. 4 is a sectional view illustrating a photodetector according to a first applied embodiment of the inventive concept.

FIG. 4 is a sectional view illustrating a photodetector according to a first applied embodiment of the inventive concept.

Referring to FIG. 4, the photodetector according to the first applied embodiment of the inventive concept may include the carrier multiplication layer 20, in which a silicon/germanium superlattice structure is provided. The superlattice structure may include a plurality of material layers that are stacked in an alternating manner. Here, the material layers of the superlattice structure may be configured to have a difference in terms of a mixing ratio of silicon to germanium. For example, a first material layer 25 may include $Si_{1-x}Ge_x$, and a second material layer 26 may include $Si_{1-y}Ge_y$. The first material layer 25 and the second material layer 26 may be formed using an epitaxial process based on a chemical vapor deposition. The first applied example is different from the first embodiment in that intrinsic germanium for the carrier multiplication layer 20 is replaced with the silicon/germanium superlattice structure.

Figure 5:
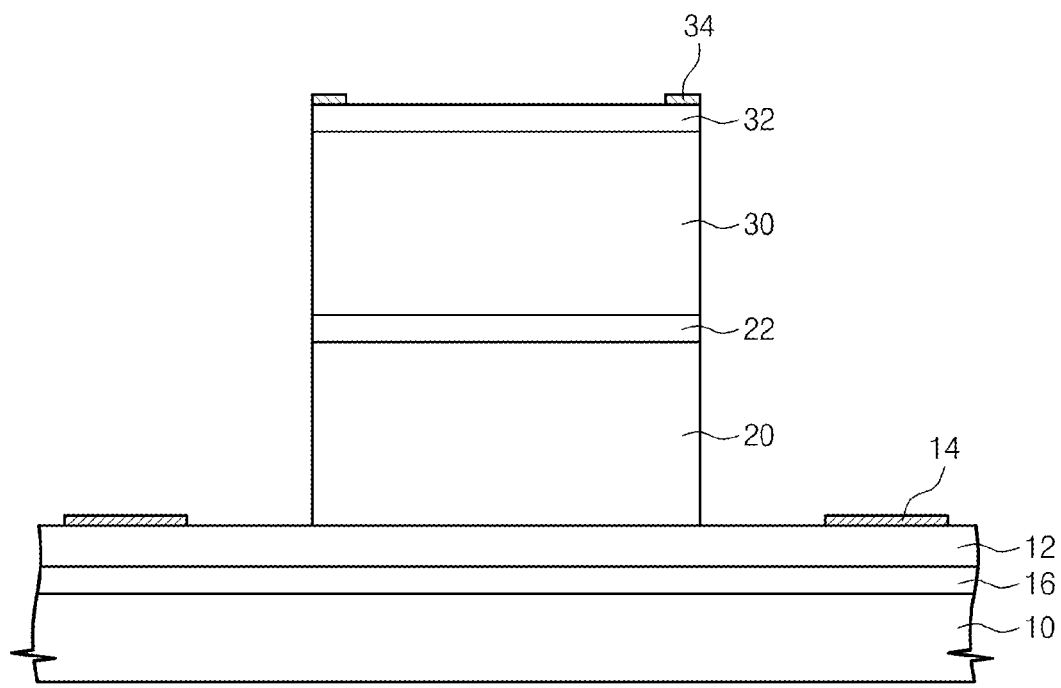
FIG. 5 is a sectional view illustrating a photodetector according to a second applied embodiment of the inventive concept.

FIG. 5 is a sectional view illustrating a photodetector according to a second applied embodiment of the inventive concept.

Referring to FIG. 5, a waveguide-type photodetector according to the second applied embodiment of the inventive concept may be realized using a silicon-on-insulator (SOI) wafer, for example, including a buried oxide layer 16 interposed between the substrate 10 and the first contact layer 12. The SOI wafer may be a commercialized product and include a buried oxide (BOX) layer on a bulk silicon wafer. The use of the SOI wafer makes it possible to form an optical waveguide device with ease. The second applied embodiment may differ from the first embodiment in that the buried oxide layer 16 may be added between the substrate 10 and the first contact layer 12 of the first embodiment to form the SOI wafer and the floating guard ring 24 may be removed.

Figure 6:
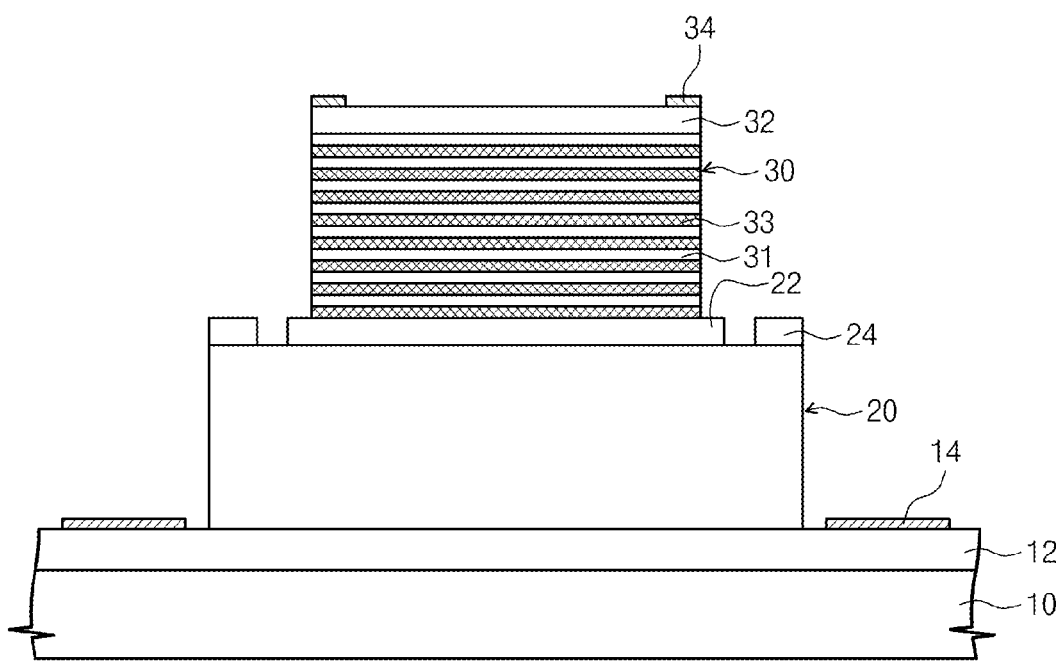
FIG. 6 is a sectional view illustrating a photodetector according to a second embodiment of the inventive concept.

FIG. 6 is a sectional view illustrating a photodetector according to a second embodiment of the inventive concept.

Referring to FIG. 6, the photodetector according to the second embodiment of the inventive concept may include a super lattice structure consisting of a third material layer 31 and a fourth material layer 33, which may be provided as the absorption layer 30. The second embodiment may differ from the first embodiment, in that intrinsic germanium of the absorption layer 30 is replaced with the superlattice structure. The third and fourth material layers 31 and 33 of the superlattice structure may be different from each other in terms of a mixing ratio (mole fraction) of silicon to germanium. For example, the third material layer 31 may include $Si_{1-x}Ge_x$, and the fourth material layer 33 may include $Si_{1-y}Ge_y$.

Figure 7:
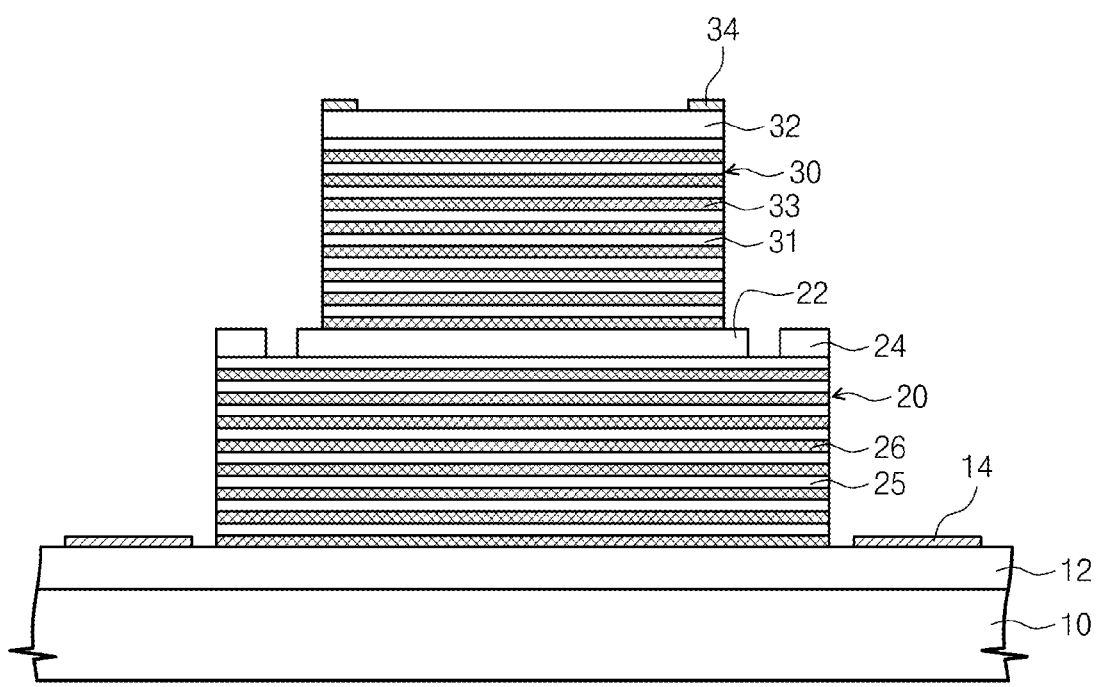
FIG. 7 is a sectional view illustrating a photodetector according to a third applied embodiment of the inventive concept.

FIG. 7 is a sectional view illustrating a photodetector according to a third applied embodiment of the inventive concept.

Referring to FIG. 7, the photodetector according to the third applied embodiment of the inventive concept may include the carrier multiplication layer 20 and the absorption layer 30 that are configured to have the superlattice structure. The third applied embodiment may differ from the first embodiment, in that intrinsic germanium layers for the carrier multiplication layer 20 and the absorption layer 30 are replaced with the superlattice structure. The superlattice structure of the carrier multiplication layer 20 may include the first material layer 25 and the second material layer 26. The superlattice structure of the absorption layer 30 may include the third material layer 31 and the fourth material layer 33. The first material layer 25 and the third material layer 31 may be configured to have the same mixing ratio of silicon to germanium, but example embodiments of the inventive concept may not be limited thereto. The first material layer 25 and the third material layer 31 may be configured to be different from each other in terms of the mixing ratio (mole fraction) of silicon to germanium. Similarly, the second material layer 26 and the fourth material layer 33 may be configured to have the same mixing ratio of silicon to germanium.

Although not shown, the carrier multiplication layer 20 and the charge layer 22 of the photodetector may be configured to have the same area as those of the absorption layer 30 and the second contact layer 32.

Figure 8:
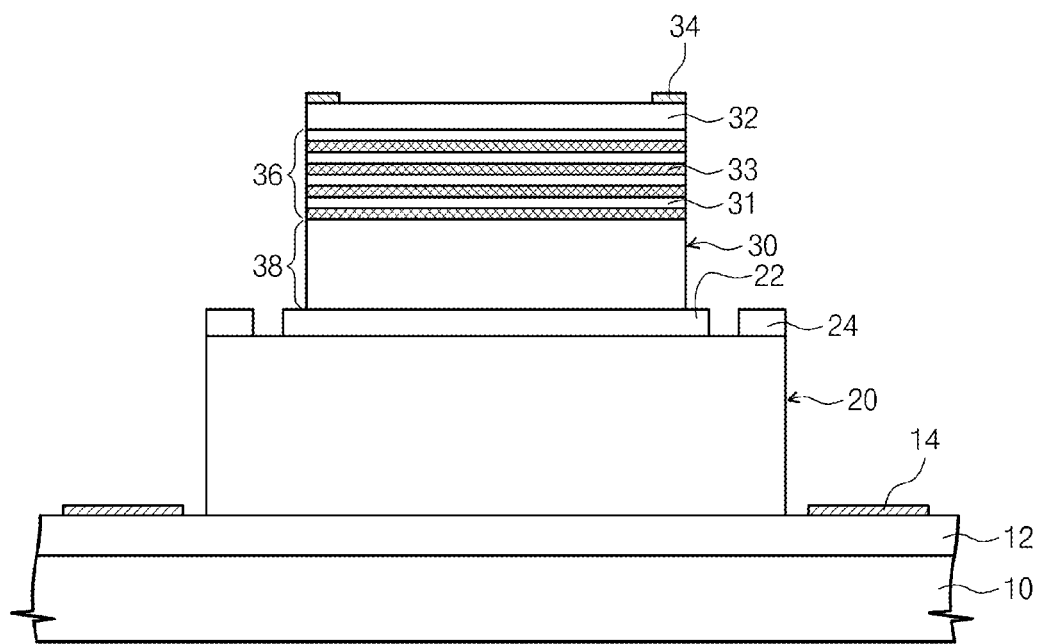
FIG. 8 is a sectional view illustrating a photodetector according to a third embodiment of the inventive concept.

FIG. 8 is a sectional view illustrating a photodetector according to a third embodiment of the inventive concept.

Referring to FIG. 8, the photodetector according to the third embodiment of the inventive concept may include the absorption layer 30 including both of a superlattice layer 36 and an intrinsic layer 38. According to the third embodiment, the absorption layer 30 of the first embodiment may be replaced with the superlattice layer 36 and the intrinsic layer 38. As shown in FIG. 8, the superlattice layer 36 and the intrinsic layer 38 may be formed to have the same thickness (e.g., half the thickness of the absorption layer 30) as each other, but example embodiments of the inventive concept may not be limited thereto. The superlattice layer 36 may be a silicon/germanium superlattice and include the third material layer 31 and the fourth material layer 33. The third material layer 31 may include $Si_{1-x}Ge_x$, and the fourth material layer 33 may include $Si_{1-y}Ge_y$. The intrinsic layer 38 may include an intrinsic germanium layer.

Figure 9:
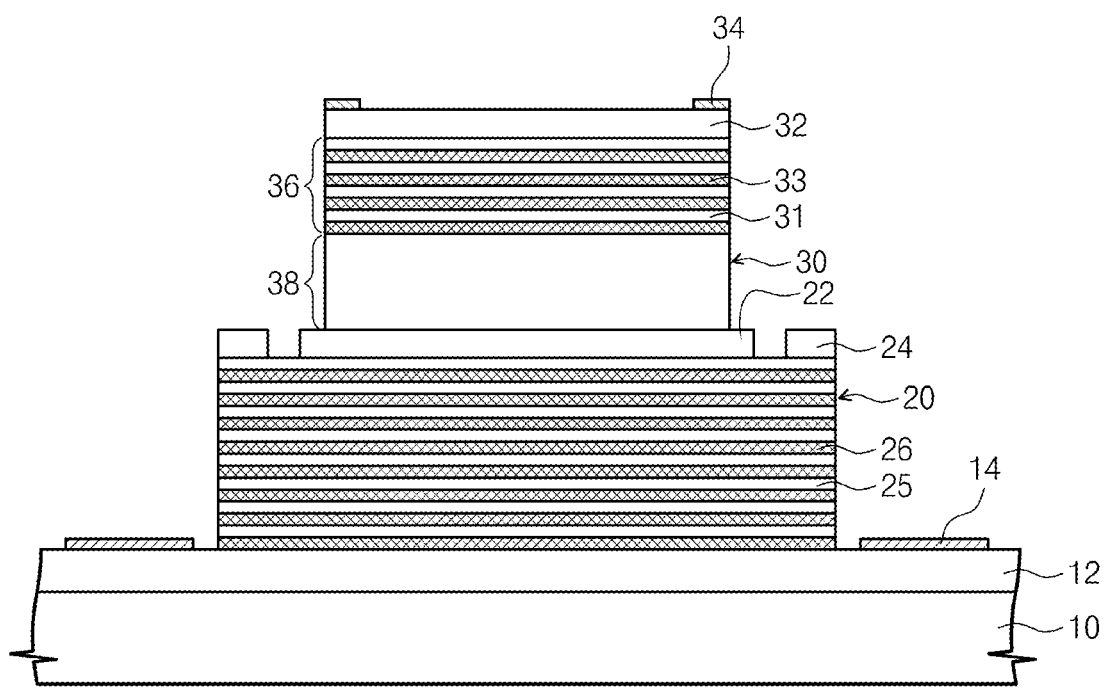
FIG. 9 is a sectional view illustrating a photodetector according to a fourth applied embodiment of the inventive concept.

FIG. 9 is a sectional view illustrating a photodetector according to a fourth applied embodiment of the inventive concept.

Referring to FIG. 9, the photodetector according to the fourth applied embodiment of the inventive concept may include the absorption layer 30 with the superlattice layer 36 and the intrinsic layer 38 and the carrier multiplication layer 20 having the superlattice structure. The fourth applied embodiment may differ from the first embodiment, in that intrinsic germanium for the absorption layer 30 is replaced with the superlattice layer 36 and the intrinsic layer 38, and that intrinsic germanium for the carrier multiplication layer 20 is replaced with the superlattice structure.

Figure 10:
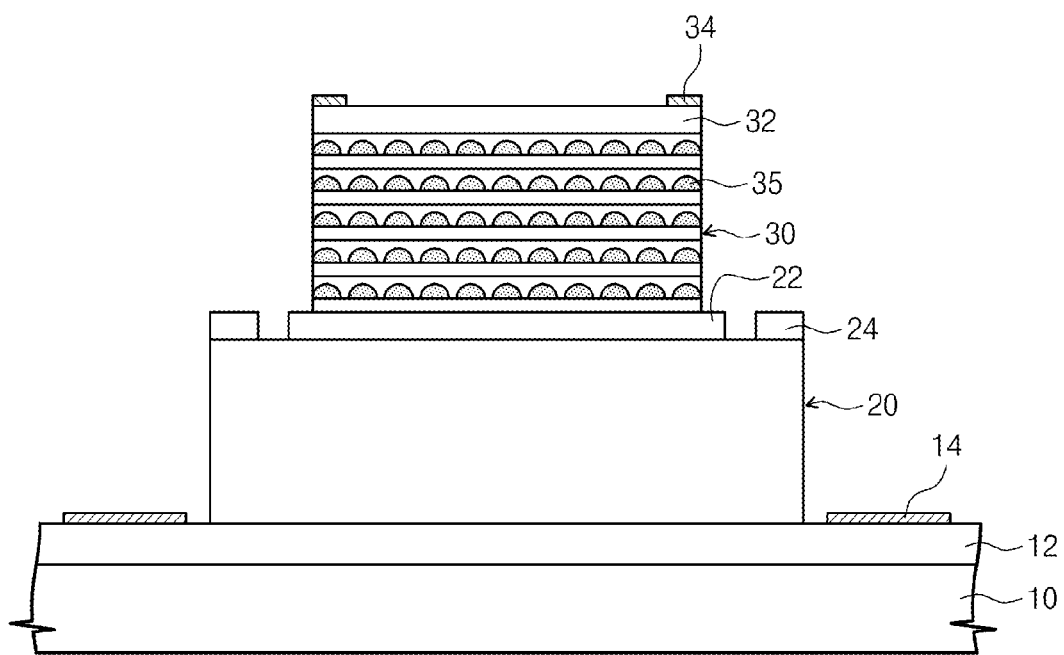
FIG. 10 is a sectional view illustrating a photodetector according to a fourth embodiment of the inventive concept.

FIG. 10 is a sectional view illustrating a photodetector according to a fourth embodiment of the inventive concept.

Referring to FIG. 10, the photodetector according to the fourth embodiment of the inventive concept may include the absorption layer 30 comprised of quantum dot structure layer 35. The fourth embodiment may differ from the first embodiment, in that intrinsic germanium for the absorption layer 30 is replaced with a layer of the at least one quantum dot 35. The at least one quantum dot structure layer 35 may include germanium/silicon. The at least one quantum dot structure layer 35 may be provided to have a self-assembled quantum dot array structure or a vertical-type quantum dot array structure in a double-barrier quantum well structure.

Figure 11:
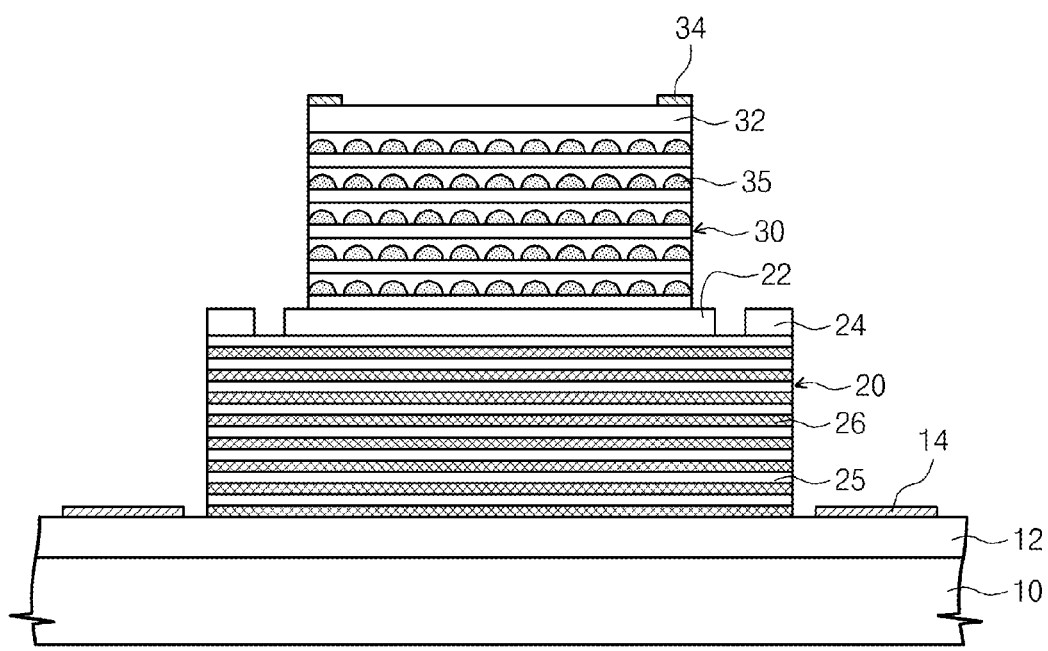
FIG. 11 is a sectional view illustrating a photodetector according to a fifth applied embodiment of the inventive concept.

FIG. 11 is a sectional view illustrating a photodetector according to a fifth applied embodiment of the inventive concept.

Referring to FIG. 11, the photodetector according to the fifth applied embodiment of the inventive concept may include the absorption layer 30 with the at least one quantum dot structure layer 35 and the carrier multiplication layer 20 having the superlattice structure. The fifth applied embodiment may differ from the first embodiment, in that intrinsic germanium for the absorption layer 30 is replaced with the quantum dot structure layer and intrinsic germanium for the carrier multiplication layer 20 is replaced with the superlattice structure.

Figure 12:
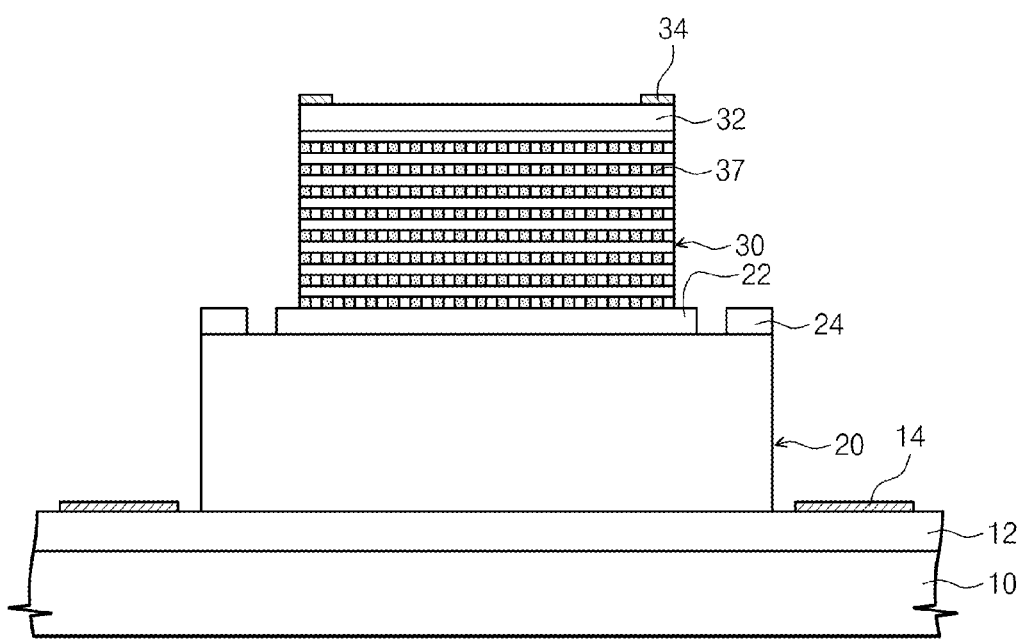
FIG. 12 is a sectional view illustrating a photodetector according to a fifth embodiment of the inventive concept.

FIG. 12 is a sectional view illustrating a photodetector according to a fifth embodiment of the inventive concept.

Referring to FIG. 12, the photodetector according to the fifth embodiment of the inventive concept may include the absorption layer 30 with at least one quantum wire 37. The fifth embodiment may differ from the first embodiment, in that the at least one quantum wire 37 is provided in the absorption layer 30 made of intrinsic germanium. The at least one quantum wire 37 may be provided to have an array structure in the absorption layer 30. The carrier multiplication layer 20 may include intrinsic germanium.

Figure 13:
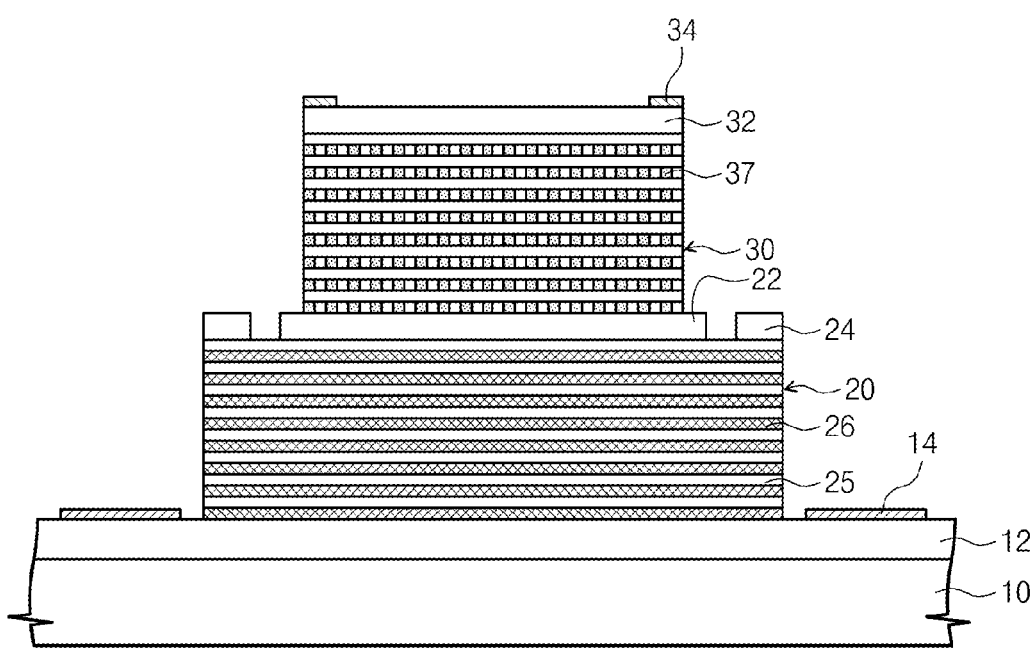
FIG. 13 is a sectional view illustrating a photodetector according to a sixth applied embodiment of the inventive concept.

FIG. 13 is a sectional view illustrating a photodetector according to a sixth applied embodiment of the inventive concept.

Referring to FIG. 13, the photodetector according to the sixth applied embodiment of the inventive concept may include the absorption layer 30 comprised of at least one quantum wire structure layer 37 and the carrier multiplication layer 20 having the superlattice structure. The sixth applied embodiment may differ from the first embodiment, in that the at least one germanium quantum wire structure layer 37 is provided in the absorption layer 30, and that intrinsic germanium for the carrier multiplication layer 20 is replaced with the superlattice structure.

The photodetector according to example embodiments of the inventive concept may include a substrate, a first contact layer, a carrier multiplication layer, a charge layer, an absorption layer, and a second contact layer. All of the carrier multiplication layer, the charge layer, and the absorption layer may contain germanium. The photodetector may have a germanium-on-silicon structure, in which avalanche took place at a relatively low voltage of about 20V. High avalanche operation voltage (e.g., of about 30V or higher) is needed for the conventional III-V compound semiconductor avalanche photodetector or the conventional silicon-based avalanche photodetector with a germanium absorbing layer/a silicon charge layer/a silicon carrier multiplication layer. In this sense, the photodetector according to example embodiments of the inventive concept can provide a property of high sensitivity at a relatively low voltage.

Further, in the photodetector with the germanium carrier multiplication layer, a property of −3 dB bandwidth can be increased even when the voltage becomes higher than the avalanche voltage. This means that the photodetector according to example embodiments of the inventive concept can be operated with high-gain and high-speed.

While example embodiments of the inventive concepts have been particularly shown and described, it will be understood by one of ordinary skill in the art that variations in form and detail may be made therein without departing from the spirit and scope of the attached claims.

What is claimed is:

1. An avalanche photodetector, comprising:
a silicon substrate;
a first contact layer on the silicon substrate;
a carrier multiplication layer on the first contact layer;
a charge layer on the carrier multiplication layer;
a floating guard ring on the carrier multiplication layer, coplanar with the charge layer and formed of the same material as the charge layer;
an absorption layer on the charge layer; and
a second contact layer on the absorption layer,
wherein the carrier multiplication layer, the charge layer, and the absorption layer comprise germanium.

2. The photodetector of claim 1, wherein the absorption layer comprises intrinsic germanium.

3. The photodetector of claim 1, wherein the carrier multiplication layer comprises intrinsic germanium.

4. The photodetector of claim 1, wherein the first contact layer is doped with first impurities.

5. The photodetector of claim 4, wherein the charge layer is doped with second impurities, whose conductivity type is opposite to the first impurities.

6. The photodetector of claim 5, wherein the second contact layer is doped with the second impurities.

7. The photodetector of claim 5, wherein the second contact layer comprises germanium.

8. The photodetector of claim 5, wherein the second contact layer comprises polysilicon.

9. The photodetector of claim 1, wherein the first contact layer comprises silicon.

10. The photodetector of claim 1, wherein the carrier multiplication layer comprises a germanium and silicon superlattice.

11. The photodetector of claim 1, wherein the absorption layer comprises a germanium and silicon superlattice.

12. The photodetector of claim 1, further comprising, a buried oxide layer between the substrate and the first contact layer.

13. The photodetector of claim 1, wherein the absorption layer comprises at least one quantum dot structure or at least one quantum wire structure.

14. The photodetector of claim 1, wherein the absorption layer comprises a germanium and silicon superlattice layer and an intrinsic germanium layer.

15. A method of fabricating a photodetector, comprising:
forming a first contact layer on a substrate;
forming a carrier multiplication layer on the first contact layer;
forming a charge layer on the carrier multiplication layer;
forming a floating guard ring on the carrier multiplication layer using the charge layer; and
forming an absorption layer on the charge layer,
wherein all of the carrier multiplication layer, the absorption layer, and the charge layer comprise germanium and are formed in an in-situ manner in one chamber or cluster.

16. The method of claim 15, wherein the first contact layer is formed of a silicon layer doped with first impurities.

17. The method of claim 16, further comprising, forming a second contact layer on the absorption layer.

18. The method of claim 17, wherein the second contact layer is formed of a poly silicon layer doped with second impurities.

* * * * *